United States Patent
Gomez et al.

(10) Patent No.: US 9,350,376 B2
(45) Date of Patent: *May 24, 2016

(54) FRAME ADAPTIVE DIGITAL TO ANALOG CONVERTER AND METHODS FOR USE THEREWITH

(71) Applicant: BROADCOM CORPORATION, Irvine, CA (US)

(72) Inventors: Ramon Alejandro Gomez, San Juan Capistrano, CA (US); Thomas Joseph Kolze, Phoenix, AZ (US); Bruce Joseph Currivan, Los Altos, CA (US)

(73) Assignee: BROADCOM CORPORATION, Irvine, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/814,968

(22) Filed: Jul. 31, 2015

(65) Prior Publication Data

US 2015/0341045 A1 Nov. 26, 2015

Related U.S. Application Data

(63) Continuation of application No. 14/243,105, filed on Apr. 2, 2014, now Pat. No. 9,130,587.

(60) Provisional application No. 61/937,889, filed on Feb. 10, 2014, provisional application No. 61/933,180, filed on Jan. 29, 2014.

(51) Int. Cl.
*H03M 1/66* (2006.01)
*H03M 1/74* (2006.01)
*H03M 1/06* (2006.01)

(Continued)

(52) U.S. Cl.
CPC ............. *H03M 1/742* (2013.01); *H03M 1/002* (2013.01); *H03M 1/0648* (2013.01); *H03M 1/662* (2013.01); *H03M 1/68* (2013.01); *H03M 1/747* (2013.01)

(58) Field of Classification Search
CPC ..... H03M 1/747; H03M 1/745; H03M 1/742; H03M 1/66; H03M 1/662; H03M 1/70; H03M 3/504; H03M 3/464
USPC .................................................. 341/141–160
See application file for complete search history.

(56) References Cited

U.S. PATENT DOCUMENTS

| | | | | | |
|---|---|---|---|---|---|
| 6,163,283 | A | * | 12/2000 | Schofield | H03M 1/685 341/133 |
| 6,218,974 | B1 | * | 4/2001 | Dedic | H03M 1/662 341/141 |
| 7,317,414 | B2 | * | 1/2008 | Bult | H03M 1/0624 341/144 |

(Continued)

*Primary Examiner* — Lam T Mai
(74) *Attorney, Agent, or Firm* — Garlick & Markison; Bruce E. Stuckman

(57) ABSTRACT

A digital to analog converter (DAC) includes a thermometer coder that generates a plurality of micro-current source analog controls on a frame-by-frame or symbol-by-symbol basis and to process digital inputs from symbols or frames of data based on a thermometer coding to generate a plurality of micro-current source inputs. A plurality of micro-current sources generate a corresponding plurality of micro-current source outputs in response to the plurality of micro-current source inputs, wherein first selected ones of the plurality of micro-current sources are powered-off in response to the plurality of micro-current source analog controls for a first symbol or frame of the plurality of symbols or frames of data. A summing circuit generates an analog output based a sum of the corresponding plurality of micro-current source outputs.

20 Claims, 7 Drawing Sheets

(51) Int. Cl.
*H03M 1/00* (2006.01)
*H03M 1/68* (2006.01)

(56) References Cited

U.S. PATENT DOCUMENTS

| | | | | |
|---|---|---|---|---|
| 7,746,259 B2* | 6/2010 | Dedic | ............. | H03K 17/04123 |
| | | | | 341/136 |
| 7,796,073 B2* | 9/2010 | Ogawa | ................ | H04K 17/302 |
| | | | | 341/118 |
| 8,217,817 B2* | 7/2012 | Ogawa | ................ | H03K 17/302 |
| | | | | 341/136 |
| 9,130,587 B2* | 9/2015 | Gomez | ................ | H03M 1/662 |
| 2001/0040520 A1* | 11/2001 | Bult | .................... | H03M 1/0624 |
| | | | | 341/144 |
| 2007/0126617 A1* | 6/2007 | Shimaya | ............... | H03M 1/066 |
| | | | | 341/144 |
| 2009/0309775 A1* | 12/2009 | Ikoma | ................... | H03M 1/687 |
| | | | | 341/144 |
| 2011/0012770 A1* | 1/2011 | Ikoma | ................... | H03M 1/687 |
| | | | | 341/144 |
| 2015/0214974 A1* | 7/2015 | Currivan | ............... | H03M 1/002 |
| | | | | 341/141 |

* cited by examiner

FRAME ADAPTIVE DIGITAL TO ANALOG CONVERTER AND METHODS FOR USE THEREWITH

CROSS REFERENCE TO RELATED PATENTS/PATENT APPLICATIONS

The present U.S. Utility Patent Application claims priority pursuant to 35 U.S.C. §120 as a continuation of U.S. Utility application Ser. No. 14/243,105, entitled "FRAME ADAPTIVE DIGITAL TO ANALOG CONVERTER AND METHODS FOR USE THEREWITH", filed Apr. 2, 2014, which claims priority pursuant to 35 U.S.C. §119(e) to U.S. Provisional Application No. 61/937,889, entitled "FRAME ADAPTIVE DIGITAL TO ANALOG CONVERTER AND METHODS FOR USE THEREWITH", filed Feb. 10, 2014, and U.S. Provisional Application No. 61/933,180, entitled "DIGITAL TO ANALOG CONVERTER WITH THERMOMETER CODING AND METHODS FOR USE THEREWITH", filed Jan. 29, 2014, all of which are hereby incorporated herein by reference in their entirety and made part of the present U.S. Utility Patent Application for all purposes.

BACKGROUND

1. Technical Field

The various embodiments relate generally to communication systems including point-to-multipoint communication systems such as cable modem systems and digital to analog converters used therein.

2. Description of Related Art

In conventional point-to-multipoint communication systems, a network supports bidirectional data communication between a central entity and multiple customer premises equipment (CPE). Example point-to-multipoint communication systems include cable modem systems, fixed wireless systems, and satellite communication systems. In each system, the communication path from the central entity to the CPE is typically referred to as the downstream, while the communication path from the CPE to the central entity is typically referred to as the upstream.

One type of point-to-multipoint system is a cable modem system, which typically includes a headend that is capable of communicating with multiple CPEs, each of which provides cable modem functionality. In a cable modem system, the CPE can be a cable modem, a set-top box, or a cable gateway, to provide some examples.

DOCSIS (Data Over Cable Service Interface Specification) refers to a group of specifications published by CableLabs that define industry standards for cable headend and cable modem equipment. In part, DOCSIS sets forth requirements and objectives for various aspects of cable modem systems including operations support systems, management, data interfaces, as well as network layer, data link layer, and physical layer transport for data over cable systems. One version of the DOCSIS specification is version 2.0, and includes the DOCSIS Radio Frequency Interface (RFI) Specification SP-RFIv2.0-103-021218 (hereinafter "DOCSIS RFI Specification").

DOCSIS 2.0 supports the ITU-T J.83 B (hereinafter "Annex B") standard for downstream physical (PHY) layer transmissions from the headend to cable modems. Advances in communication technology are requiring increasingly more bandwidth, which can lead to deficiencies in channel capacity, especially with respect to these downstream transmissions. For example, even cable plants operating at a frequency of 750 MHz are being challenged with capacity shortages, due to increased demand for video on demand (VOD), high-definition television (HDTV), digital services, and expanding analog channel lineups. Numerous schemes have been proposed to help alleviate the downstream bandwidth issues, including analog spectrum reclamation and advanced video coding techniques. A DOCSIS 3.0 specification with channel bonding support has been in use for several years and a DOCSIS 3.1 proposal has been circulated.

DETAILED DESCRIPTION

Figure 1:
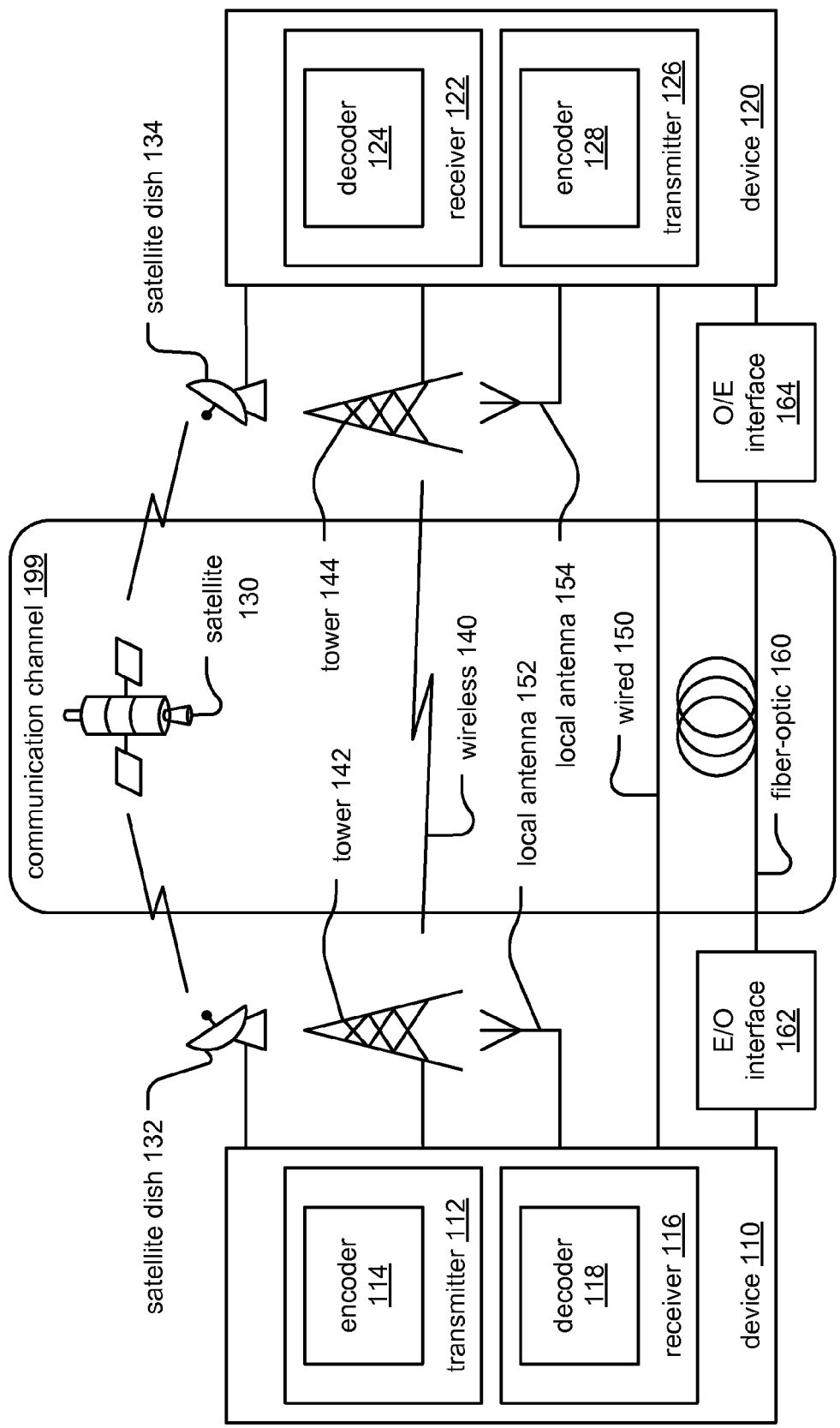
FIG. 1 illustrates an embodiment 100 of a communication system.

FIG. 1 illustrates an embodiment 100 of a communication system. In particular, communication system 100 is a communication channel 199 that communicatively couples a communication device 110 (including a transmitter 112 having an encoder 114 and including a receiver 116 having a decoder 118) situated at one end of the communication channel 199 to another communication device 120 (including a transmitter 126 having an encoder 128 and including a receiver 122 having a decoder 124) at the other end of the communication channel 199. The respective devices 110 and 120 are operative to send and/or receive transmissions to transfer data between one another.

In some embodiments, either of the communication devices 110 and 120 may only include a transmitter or a receiver. There are several different types of media by which the communication channel 199 may be implemented (e.g., a satellite communication channel 130 using satellite dishes 132 and 134, a wireless communication channel 140 using towers 142 and 144 and/or local antennas 152 and 154, a wired communication channel 150, and/or a fiber-optic communication channel 160 using electrical to optical (E/O) interface 162 and optical to electrical (O/E) interface 164)). In addition, more than one type of media may be implemented and interfaced together thereby forming the communication channel 199.

It is noted that such communication devices 110 and/or 120 may be stationary or mobile without departing from the scope and spirit of the various embodiments. For example, either one or both of the communication devices 110 and 120 may be implemented in a fixed location or may be a mobile communication device with capability to associate with and/or communicate with more than one network access point (e.g., different respective access points (APs) in the context of a mobile communication system including one or more wireless local area networks (WLANs), different respective satellites in the context of a mobile communication system including one or more satellite, or generally, different respective network access points in the context of a mobile communication system including one or more network access points by which communications may be effectuated with communication devices 110 and/or 120. Any of the various types of coding described herein can be employed within any such desired communication system (e.g., including those variations described with respect to FIG. 1), any information storage device (e.g., hard disk drives (HDDs), network information storage devices and/or servers, etc.) or any application in which information encoding and/or decoding is desired.

While communication between only two devices 110 and 120 is shown, it should be noted that a device 110 can optionally communicate with multiple devices 120. In a particular embodiment of communication system 100, the communication channel 199 includes a cable system plant that supports bidirectional communication between a device 110 implemented as a CMTS (cable modem termination system) and a plurality of devices 120 implemented as cable modems. In this embodiment, the CMTS and cable modems operate in accordance with a DOCSIS protocol such as a DOCSIS 3.1 protocol or other cable modem protocol that employs OFDM modulation on the downstream link from the CMTS and the cable modems and further the upstream link from the cable modems to the CMTS. Fidelity requirements for DOCSIS 3.1 are stringent. Energy efficiency at higher output ranges is also important to reduce energy consumption. To meet both of these requirements a differing digital to analog converter (DAC) structure may be required.

In an embodiment, the transmitter 126 of the devices 120 includes a DAC that implements one or more functions and features described in conjunction with FIGS. 3-14 that follow.

Figure 2:
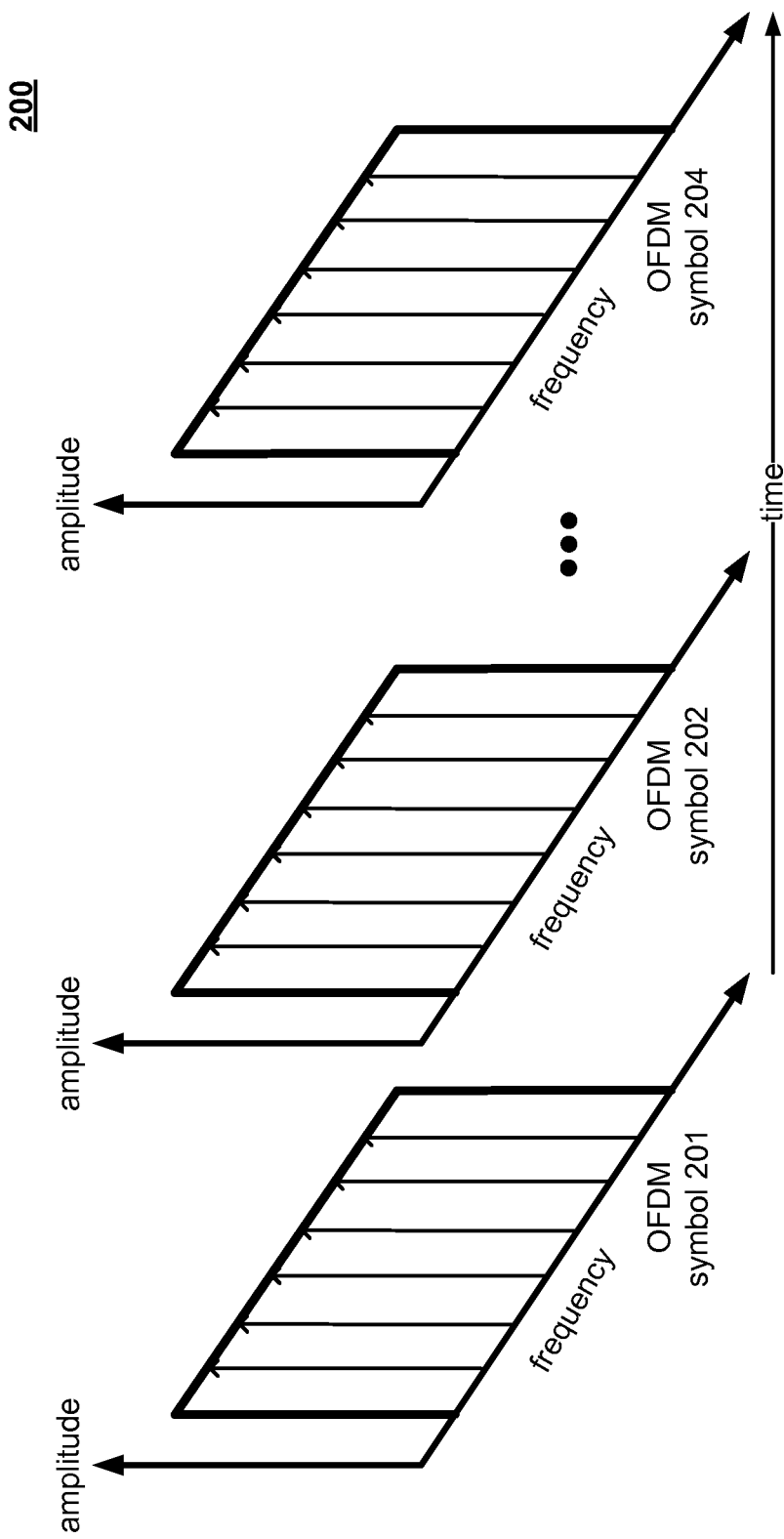
FIG. 2 illustrates an embodiment 200 of OFDM (Orthogonal Frequency Division Multiplexing).

FIG. 2 illustrates an embodiment 200 of OFDM (Orthogonal Frequency Division Multiplexing). In particular, an OFDM modulation scheme is presented for use in conjunction with transmissions over communication channel 199 via devices 110 and 120. OFDM modulation may be viewed a dividing up an available spectrum into a plurality of narrowband sub-carriers (e.g., lower data rate carriers). Typically, the frequency responses of these sub-carriers are overlapping and orthogonal. Each sub-carrier may be modulated using any of a variety of modulation coding techniques. A plurality of symbols 201, 202 and 204 are presented over time.

OFDM modulation operates by performing simultaneous transmission of a larger number of narrowband carriers (or multi-tones). Oftentimes a guard interval (GI) or guard space is also employed between the various OFDM symbols (201, 202 . . . 204) to try to minimize the effects of ISI (Inter-Symbol Interference) that may be caused by the effects of multi-path within the communication system (which can be particularly of concern in wireless communication systems). In addition, a CP (Cyclic Prefix) may also be employed within the guard interval to allow switching time (when jumping to a new band) and to help maintain orthogonality of the OFDM symbols. Generally speaking, OFDM system design is based on the expected delay spread within the communication system (e.g., the expected delay spread of the communication channel).

Figure 3:
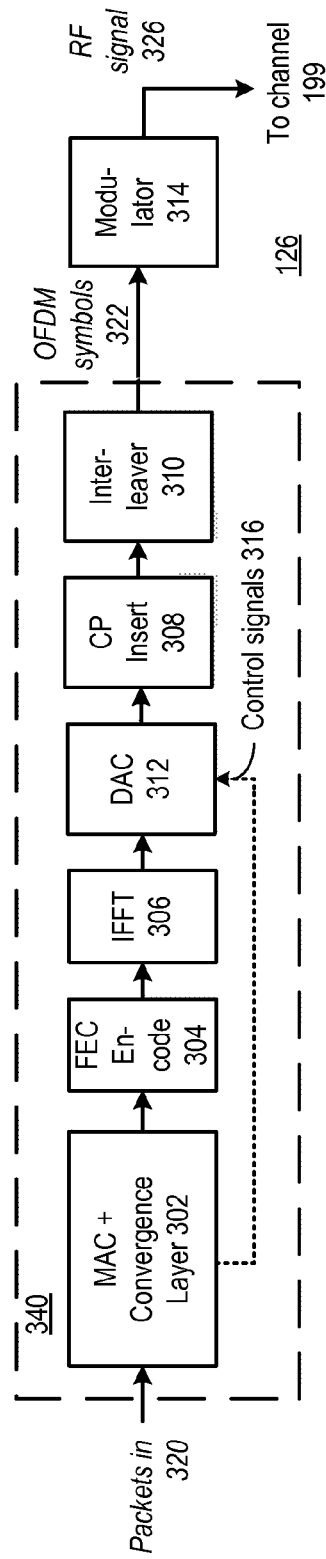
FIG. 3 illustrates an embodiment of a transmitter 126.

FIG. 3 illustrates an embodiment of a transmitter 126. In particular, a transmitter 126 is presented for use in conjunction with devices 110 and 120 and with communication channel 199. More specifically, transmitter 126 can be used for upstream communication of OFDM symbols from cable modem to a CMTS via a cable plant implementation of communication channel 199. Input packets 320 (that can include command data and other data) are processed by a baseband processor or other data processing element 340 to generate a plurality of OFDM symbols 322. As shown, the baseband processor 340 includes functional modules that implement MAC and convergence layer 302, FEC (forward error correction) encoding 304, IFFT (inverse Fast Fourier transform) 306, Digital to analog converter (DAC) 312, cyclic prefix insertion 308, and interleaver 310. This stream of OFDM symbols 322 stream is modulated and amplified via modulator 314 into an RF signal 326 for introduction onto the communication channel 199. As shown, the DAC 312 optionally receives control signals 316 from the MAC and convergence layer module 302 that indicates, for example, the position of a symbol in a frame or other period, the number of subcarriers in use, other modulation and coding information and/or other control information that can be used to adapt the DAC 312 to a maximum current in use for a symbol, a frame or other time period of communications.

The baseband processor or other data processing element 340 can be implemented via a single processing device or a plurality of processing devices. Such a processing device may be a microprocessor, micro-controller, digital signal processor, microcomputer, central processing unit, field programmable gate array, programmable logic device, state machine, logic circuitry, analog circuitry, digital circuitry, and/or any device that manipulates signals (analog and/or digital) based on hard coding of the circuitry and/or operational instructions. The processing module, module, processing circuit, and/or processing unit may have an associated memory and/or an integrated memory element, which may be a single memory device, a plurality of memory devices, and/or embedded circuitry of the processing module, module, processing circuit, and/or processing unit. Such a memory device may be a read-only memory (ROM), random access memory (RAM), volatile memory, non-volatile memory, static memory, dynamic memory, flash memory, cache memory, and/or any device that stores digital information. Note that if the processing module, module, processing circuit, and/or processing unit includes more than one processing device, the processing devices may be centrally located (e.g., directly coupled together via a wired and/or wireless bus structure) or may be distributedly located (e.g., cloud computing via indirect coupling via a local area network and/or a wide area network). Further note that if the processing module, module, processing circuit, and/or processing unit implements one or more of its functions via a state machine, analog circuitry, digital circuitry, and/or logic circuitry, the memory and/or memory element storing the corresponding operational instructions may be embedded within, or external to, the circuitry comprising the state machine, analog circuitry, digital circuitry, and/or logic circuitry. Still further note that, the memory element may store, and the processing module, module, processing circuit, and/or processing unit executes, hard coded and/or operational instructions corresponding to at least some of the steps and/or functions illustrated in one or more of the Figures. Such a memory device or memory element can be included in an article of manufacture.

Figure 4:
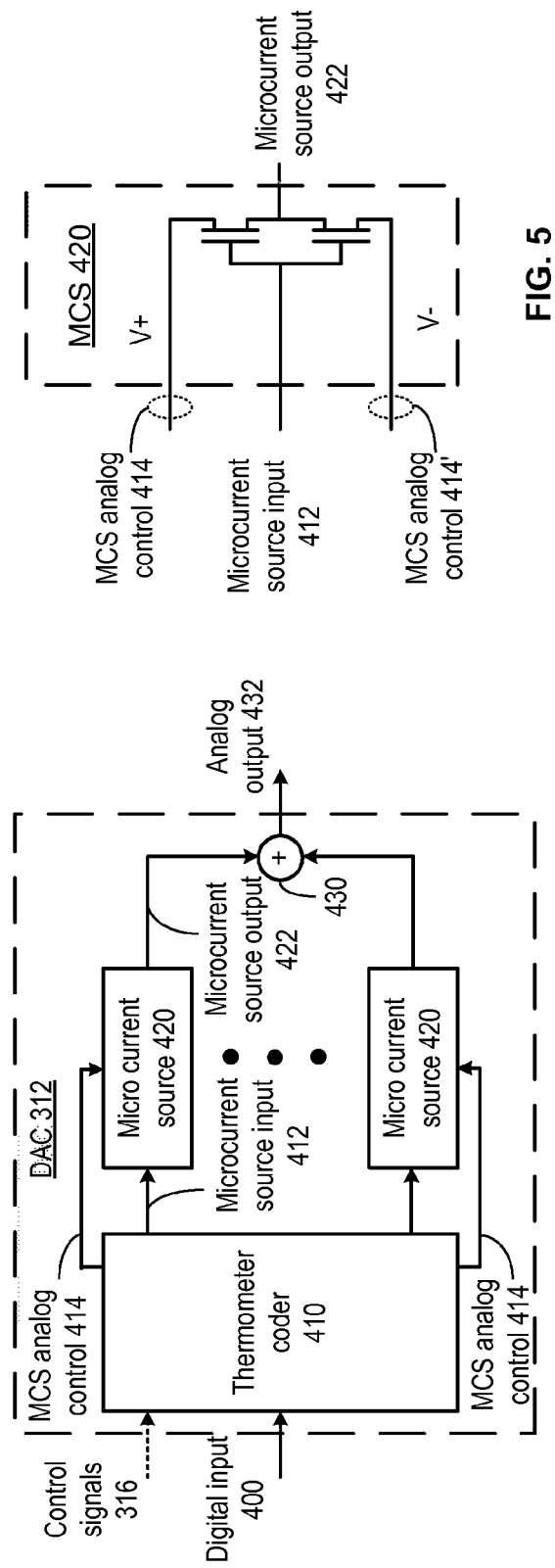
FIG. 4 illustrates an embodiment of a digital to analog converter 312.

FIG. 4 illustrates an embodiment of a digital to analog converter 312. In particular, DAC 312 is presented that includes a thermometer coder 410, a plurality of micro-current sources 420 and a summing element 430. In operation, a digital input 400 is processed by thermometer coder 410 into a plurality of micro-current source inputs 412. The micro-current sources 420 generate a plurality of micro-current source outputs 422 that are summed by summing element 430 to generate the analog output 432.

In operation, the thermometer coder 410 is configured to process the digital input 400 based on a thermometer coding to generate a plurality of micro-current source inputs 412 and a plurality of micro-current source analog controls 414. The plurality of micro-current sources 420 are configured to generate a corresponding plurality of micro-current source outputs 422 in response to the plurality of micro-current source inputs 412. Selected ones of the plurality of micro-current sources 420 are powered-off in response to the plurality of micro-current source analog controls 414. The summing circuit 430 is configured to generate an analog output 432 based a sum of the corresponding plurality of micro-current source outputs 422.

In an embodiment, the micro-current sources 420 represent a large array of small current sources that are selectively engaged based on micro-current source inputs 412 in the form of thermometer coded data. Consider an example where the digital input 400 is presented as N-bit words. In this case, $2^N-1$ micro-current sources 420 are selectively controlled to generate a current representing any of the possible $2^N$ values from (0 0 0 . . . 0) to (1 1 1 . . . 1).

Considering an embodiment where the analog output 432 is a voltage between V and −V, and the micro-current sources 420 are ternary current sources that respond to ternary-coded micro-current source inputs 412 represented as the set (1, 0, −1). When powered on, the micro-current source 420 produces a micro-current source output 422 having either: a positive current state, a negative current state and a neutral current state. The $j^{th}$ current source generates a current $i_j$ that can be represented as:

$i_j=$
+i, if the input represents 1
0, if the input represents 0
−i, if the input represents −1

The total current generated by the DAC 312 can be represented by I, where $(-iN/2<I<iN/2-1)$. A positive current I=+k can be generated by turning on k/i micro-current sources 420 to positive values by providing these k/i micro-current sources 420 with an input representing 1 and by providing the remaining (N−k/i) current sources with inputs representing 0. Similarly, a negative current I=−k can be generated by turning on k/i micro-current sources 420 to values by providing these k/i micro-current sources 420 with an input representing −1 and by providing the remaining (N−k/i) current sources with inputs representing 0. An output voltage V can be generated by coupling the current I through a load resistor R, where V=IR. In other embodiments, other current to voltage converters can be employed.

In an embodiment, random or scheduled shuffling of micro-current sources can be employed by the thermometer coder 410 to select which of the micro-current sources 420 are used generate any particular analog output 432. This mechanism can be used to distribute heating more evenly—regardless of the number of current sources that are turned on. However, statically assigning the micro-current sources 420 to the same position in the thermometer coding will ensure monotonicity in the analog output 432 for increasing values of the digital input 400. In accordance with a static assignment, the particular current sources can be selected in a monotonic ordering that provides spatial diversity over the die.

In addition to controlling the micro-current sources 420 based on the micro-current source input 412, the thermometer coder 410 optionally generates a micro-current source (MCS) analog control 414 that powers down the micro-current sources 420 that are not in use. Energy efficiency can be gained by using a true OFF-state for micro-current sources 420 not required to meet DAC output requirements. Micro-current sources 420 not in use are turned-off. When powered-off, a micro-current source 420 produces no output current.

In a mode of operation, the thermometer coder 410 generates analog control signals 414 to turn on first selected ones of the plurality of micro-current sources. The thermometer coder 410 process a first value of the digital input 400 based on the thermometer coding to generate the plurality of micro-current source inputs 412 to generate currents from second selected ones of the plurality of ternary-coded micro-current sources—where the second selected ones of the plurality of micro-current sources are included in the first selected ones of the plurality of micro-current sources, i.e. the second selected ones of the plurality of micro-current sources are a proper subset of the first selected ones of the plurality of micro-current sources. Consider the example where Y micro-current sources are turned on. The value of Y is selected to meet or exceed the number of current sources required to process the next sample or the next group of samples corresponding to a symbol or a frame of samples during a particular period or time duration. The thermometer coder 410 processes a first value of the digital input 400 based on the thermometer coding to generate the plurality of micro-current source inputs 412 to generate currents from x micro-current sources—including x of the Y micro-current sources that were turned on. In this case Y=x+c wherein c is a value greater than zero.

In an embodiment, the thermometer coder 410 is implemented via a look up table, state machine or other processing device. As described in conjunction with FIG. 3, the DAC 312 optionally receives control signals 316 from the MAC and convergence layer module 302 that indicates, for example, the position of a symbol in a frame or other period, the number of subcarriers in use, other modulation and coding information and/or other control information that can be used to adapt the DAC 312, for example, to a maximum positive/and/or negative current. When a symbol or frame or other period is determined to have a maximum positive or negative current that is less than the overall maximum positive or negative current that can be generated, MCS analog controls 414 can be generated to turn-off micro-current sources 420 that will not be needed during this symbol, frame or other period.

Further, since a MCS 420 may react more slowly to a full power-up command via MCS analog control 414, the MCS analog control 414 can be generated to turn on some number of MCSs 420 in addition to those that are required in order to more quickly react to a new digital input that is larger than the previous digital input or a new symbol, a new frame or other period transition. A new symbol may begin with some or all MCSs 420 turned on to avoid disruption in new digital inputs 400 at the beginning of a symbol. In addition, the first symbol of a new frame may begin with some or all MCSs 420 turned on to avoid disruption in new digital inputs 400 at the beginning of a frame.

In a mode of operation, the thermometer coder 410 can employ ramping of the number of MCSs 420 that are activated via control of the micro-current source inputs 412 and/or MCS analog controls 414. In this case, thermometer coder 410 is configured to process a first value of the digital input 400 based on the thermometer coding to generate the plurality of micro-current source inputs 412 to ramp from a prior value of the analog output 432 to a new value corresponding the first value of the digital input 400. This ramping can provide smoother transitions from one code to the next, mitigate noise, etc. For example, ramping implemented via a combination of digital and analog control can be used to maintain linearity during ramp up and ramp down in symbol transitions.

In a mode of operation, first selected ones of the micro-current sources 420 are powered-off in response to the micro-current source analog controls 414 for a first frame or symbol of input data. Second selected ones of the micro-current sources 420 are powered-off in response to the micro-current source analog controls 414 for a second or subsequent frame or symbol. In addition, the micro-current source analog controls 414 can be generated to ramp from powering-off the first selected ones of the micro-current sources 420 to powering-off the second selected ones of micro-current sources 420—to transition from the first frame or symbol to the second or subsequent frame or symbol.

Figure 5:
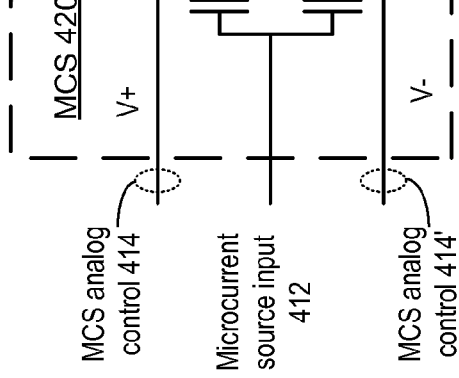
FIG. 5 illustrates an embodiment of a micro-current source 420.

FIG. 5 illustrates an embodiment of a micro-current source 420. In particular, an example of a micro-current source 420 is presented that operates based on a ternary micro-current source input 412. In this embodiment, the device is powered by MCS analog controls 414 and 414' that provide a positive supply voltage V and a negative supply voltage V. The MCS 420 generates a current $i_j$ that can be represented as:

$i_j$=+i, if the input is a voltage that represents "1"
0, if the input is a voltage that represents "0"
−i, if the input is a voltage that represents "−1"

As discussed in conjunction with FIG. 4, the thermometer coder 410 optionally generates a micro-current source (MCS) analog control 414 that powers down the micro-current source 420 when not in use. In this implementation, the MCS analog controls 414 and 414' are generated to provide a positive supply voltage V and a negative supply voltage V⁻—only when the MCS 420 is in use. Energy efficiency can be gained by using a true OFF-state for current sources not required to meet DAC output requirements. Micro-current sources 420 not in use are turned-off.

It should be noted that while a particular implementation of MCS 420 is shown, other implementations are likewise possible. Other current source circuits that respond to binary, ternary or other MCS input signal 412 and that respond to other MCS analog controls 414 and/or that include other control mechanisms to fully power-off the MCS 420 are likewise possible.

For example, the MCSs 420 can be implemented with a plurality of single-ended current sources including N/2−1 positive current sources and N/2−1 negative current sources. Consider the case where a DAC 312 processes a 10-bit digital input 400. DAC 312 could include 1023 positive current sources and 1023 negative current sources. If control signals 316 indicate that maximum positive and negative signals over a period (such as a symbol, a frame, or other period) correspond to +750 and −750, then MCS analog controls 414 could be generated to turn on 800 positive MCSs 420 and 800 negative MCSs 420. This provides some additional margin of possible current to compensate, for example, for transitions to the next period. To code a value of +100, MCS inputs 412 are generated to control 100 positive MCSs 420 to generate a current output and the remaining MCSs 420 that are turned on are controlled to generate no output current—e.g. controlled to a neutral current or ground state by digitally turning off these MCSs 420. In summary, 223 positive and 223 negative MCSs 420 are powered off via MCS analog controls 414. 700 positive and 800 negative MCSs 420 are powered on by MCS analog signals 414 but turned off via MCS inputs 412. 100 positive MCSs 420 are powered on by MCS analog signals 414 and turned on via MCS inputs 412

To code a value of −400, MCS inputs 412 are generated to control 400 negative MCSs 420 to generate a current output and the remaining MCSs 420 that are turned on are controlled to generate no output current—e.g. controlled to a neutral current or ground state by digitally turning off these MCSs 420. In summary, 223 positive and 223 negative MCSs 420 are powered off via MCS analog controls 414. 800 positive and 400 negative MCSs 420 are powered on by MCS analog signals 414 but turned off via MCS inputs 412. 400 negative MCSs 420 are powered on by MCS analog signals 414 and turned on via MCS inputs 412.

Figure 6:
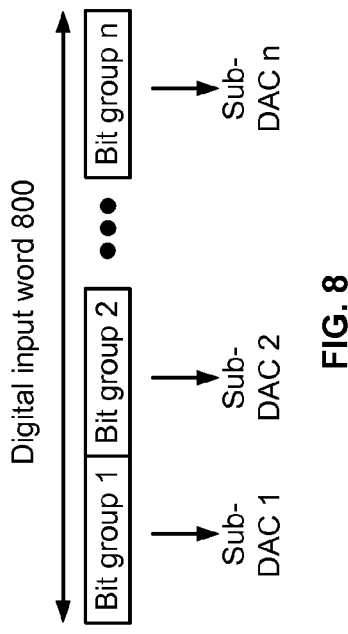
FIG. 6 illustrates an embodiment an analog control 600.

FIG. 6 illustrates an embodiment an analog control 600. As discussed in conjunction with FIG. 4, the thermometer coder 410 can employ ramping of the number of MCSs 420 that are activated via control of the micro-current source inputs 412 and/or MCS analog controls 414 in order to provide smoother transitions from one code to the next, mitigate noise, etc. Micro-current source output 422 represents example results of such a ramping. In the example shown, for periods $t_0$ to $t_1$, $t_1$ to $t_2$, $t_2$ to $t_3$, and $t_3$ to $t_4$, correspond to a sequence of four digital inputs 400 and respective outputs $x_1$, $x_2$, $x_3$ and $x_2$. Ramping (up or down) is shown at transitions between different inputs to provide smoother transitions between differing output values.

Analog control 600 represents the number of MCSs 420 turned on at any given time. In the example shown, the analog control 600 ramps the MCSs 420 at the same rate as the ramping employed at the beginning of each new change in the value of digital input 400. As further discussed in conjunction with FIG. 4, since an MCS 420 may react more slowly to a full power-up command via MCS analog control 414, the MCS analog controls 414 can be generated to turn on some number of MCSs 420 in addition to those that are required in order to more quickly react to a new digital input 400 that is larger than the previous digital input. In the example shown, the period of the first digital input begins at $t_o$ with some number of MCSs 420 turned on to avoid disruption in a new digital input 400. In other examples, the analog control 600 can be generated to change more slowly, such as on a symbol by symbol or frame by frame basis.

Figure 7:
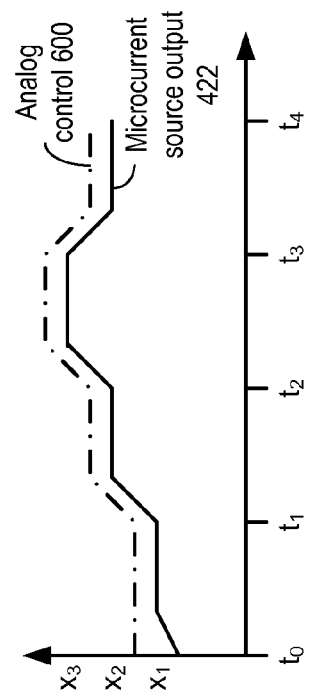
FIG. 7 illustrates another embodiment of a digital to analog converter 712.

FIG. 7 illustrates another embodiment of a digital to analog converter 712. In particular, DAC 712 is presented that can be used to implemented DAC 312 presented in conjunction with FIG. 3. DAC 712 includes a sub-DAC coder 710, a plurality of Sub-DACs 720 and a summing element 730. In operation, a digital input 400 is processed by sub-DAC coder 710 into a plurality of sub-DAC inputs 716. The sub-DACs 720 generate a plurality of sub-DAC outputs 722 that are summed by summing element 730 to generate the analog output 732.

In an embodiment, the sub-DACs 720 can each be implemented in a similar fashion to the full DAC 312 presented in conjunction with FIG. 4 via a large array of small current sources that are selectively engaged based on thermometer coded data. In other embodiment, other DAC implementations can be used to implement one or more of the sub-DACs 720.

In this configuration, the DAC 712 operates in a similar fashion to DAC 312—except that a sub-DAC takes the place of the micro current sources. For example, the sub-DAC coder 710 can generate one thermometer to select the number of sub-DACs 720 to be turned on. A second thermometer code based on the modulo remainder of the desired output and the output generated by the sub-DACs 720 that are turned on can be used to control the last sub-DAC current—i.e. to select the number of current sources to be used in the last sub-DAC that is on or otherwise to select a fractional current in this last sub-DAC 720.

In another embodiment, sub-DACs 720 can be nested. For example, different groups of bits from the digital input word 400 can be assigned to different sub-DACs 720. Each sub-DAC 720 can include current sources of different sizes—with larger current sources corresponding to more significant groups of bits being implemented via a number of statically allocated micro-current sources. In the alternative, gain can be applied to scale the sub-DACs 720 corresponding to more significant bits and/or attenuation can be applied to scale the sub-DACs 720 corresponding to less significant bits. Thermometer codes can be used by sub-DAC coder 710 to control each sub-DAC 720. This embodiment, in particular, reduces the number of control lines required—i.e. the number of sub-DAC inputs 712 can be far less than the number of control lines required to implement $2^N$ micro-current sources 420.

Consider an implementation where a 16 bit digital input 400 is broken up into four groups of bits with 4-bits each and 4 sub-DACs are used. A first sub-DAC 720 operates on the four least significant bits and includes 16 first-level individual micro-current sources that are controlled by a first thermometer code. A second sub-DAC 720 operates on the four next most significant bits and includes 16 second-level current sources that are controlled by a second thermometer code. Each of these 16 second-level current sources can be implemented via 16 parallel first level current sources. A third sub-DAC 720 operates on the four next most significant bits and includes 16 third-level current sources that are controlled by a third thermometer code. Each of these 16 third-level current sources can be implemented via 16 parallel second level current sources. Similarly, a fourth sub-DAC 720 operates on the four most significant bits and includes 16 fourth-level current sources that are controlled by a fourth thermometer code. Each of these 16 fourth-level current sources can be implemented via 16 parallel third level current sources.

Energy efficiency can be gained by using an OFF-state for sub-DACs 720 not required to meet DAC output requirements. Devices not in use are turned-off. Random or scheduled shuffling of sub-DACs can be employed by the sub-DAC coder 710 to select which of the sub-DACs 720 are used generate any particular analog output 732. In addition to controlling the sub-DACs 720 based on the sub-DAC inputs 712, the sub-DAC coder 710 optionally generates a sub-DAC (SD) analog control 714 that powers down the sub-DACs 720 that are not in use. Energy efficiency can be gained by using a true OFF-state for sub-DACs not required to meet DAC output requirements. Sub-DACs 720 not in use are turned-off/un-powered.

In an embodiment, the sub-DAC coder 710 is implemented via a look up table, state machine or other processing device. As described in conjunction with FIG. 3, the DAC 712 optionally receives control signals 316 from the MAC and convergence layer module 302 that indicates, for example, the position of a symbol in a frame or other, the number of subcarriers in use, other modulation and coding information and/or other control information that can be used to adapt the DAC 712. For example, since a sub-DAC 720 may react more slowly to a full power-up command, the SD analog control 714 can be generated to turn on some number of sub-DACs 720 in addition to those that are required in order to more quickly react to new digital inputs, symbols or frames that require more maximum current than the previous digital input/symbol or frame. In addition, a new symbol or the first symbol of a new frame may begin with some or all sub-DACs 720 turned on to avoid disruption in a new digital input 400.

In one mode of operation, the sub-DAC coder 710 can employ ramping of the number of sub-DACs 720 that are activated via control of the sub-DAC inputs 712 and/or SD analog controls 714. This ramping can provide smoother transitions from one code/symbol/frame to the next, mitigate noise, etc. For example, ramping implemented via a combination of digital and analog control can be used to maintain linearity during ramp up and ramp down in symbol or frame transitions. Possible rapid changes in maximum symbol current can be compensated by an increased cyclic prefix time. Possible rapid changes in maximum frame current can be compensated by an inter-frame gap. In the alternative a 1 μsec time for reference current transitions may have an acceptable degradation in fidelity.

In another embodiment, sub-DACs 720 can be nested as follows. To increase the dynamic range of the DAC 312, two or more sub-DACs 720 can be summed with a different gain or attenuation on each sub-DAC 720. Each sub-DAC 720 can be coded using available techniques, such as the parallel ternary technique mentioned above, normal 2s-complement coding, etc., according to the application. For example, consider a 10-bit parallel DAC and remove the 31 lowest codes from each rail. That is, the ternary parallel thermometer-coded DAC is now capable of only producing the range (32 to 1023) and (−32 to −1023); it no longer has the codes from −31 to +31. This will be sub-DAC #1. Replace this inner region (−31, 31) with a $2^{nd}$ sub-DAC with perhaps also 10 bits, with 32× attenuation (30 dB). Now if the input signal is in the region (−31, 31) the inner sub-DAC produces the output with very fine (1/32) steps, and if the signal is in the region (32 to 1023) or (−32 to −1023), the outer DAC produces the output with integer resolution. In an embodiment, these two regions can be slightly overlapped and adaptively "feathered" together using digital calibration, to make the transition as seamless as possible. If additional resolution was required in the outer region, the inner sub-DAC could be summed with the outer DAC to give fractional resolution in the outer region.

Figure 8:
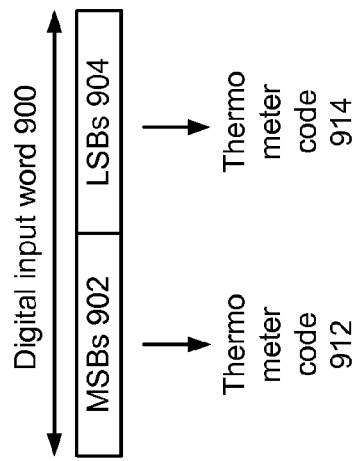
FIG. 8 illustrates an embodiment of a digital input word 800.

FIG. 8 illustrates an embodiment of a digital input word 800. In the embodiment shown the digital input word 800 can be separated into n bit groups corresponding to n nested sub-DACs. Consider again an example discussed in conjunction with FIG. 7 where n=4, a 16 bit digital input 800 is broken up into four groups of bits with 4-bits each and 4 sub-DACs are used. A first sub-DAC operates on the four least significant bits and includes 16 first-level individual micro-current sources that are controlled by a first thermometer code. A second sub-DAC operates on the four next most significant bits and includes 16 second-level current sources that are controlled by a second thermometer code. Each of these 16 second-level current sources can be implemented via 16 parallel first level current sources. A third sub-DAC operates on the four next most significant bits and includes 16 third-level current sources that are controlled by a third thermometer code. Each of these 16 third-level current sources can be implemented via 16 parallel second level current sources. Similarly, a fourth sub-DAC operates on the four most significant bits and includes 16 fourth-level current sources that are controlled by a fourth thermometer code. Each of these 16 fourth-level current sources can be implemented via 16 parallel third level current sources.

In the alternative discussed in conjunction with FIG. 7, gain can be applied to scale the sub-DACs 720 corresponding to more significant bits and/or attenuation can be applied to scale the sub-DACs 720 corresponding to less significant bits.

Figure 9:
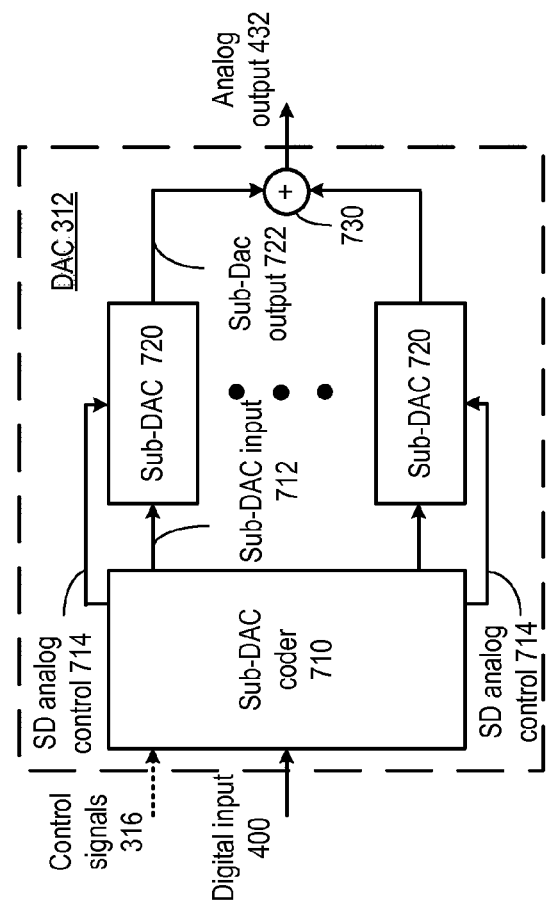
FIG. 9 illustrates an embodiment of a digital input word 900.

FIG. 9 illustrates an embodiment of a digital input word 900. Consider again an example presented in conjunction with FIG. 7 where the DAC 712 operates in a similar fashion to DAC 312—except that a sub-DAC takes the place of each of the micro-current sources. In this example, the digital input word 900 is separated into b most significant bits 902 and the c least significant bits 904. The DAC 712 includes $2^b$ sub-DACs and each sub-DAC has $2^c$ micro-current sources. The sub-DAC coder 710 can generate a thermometer code 912 based on the b most significant bits 902 to select the number of sub-DACs 720 to be turned on. A second thermometer code 914, based on the c least significant bits 904 can be used to control the last sub-DAC current—i.e. to select the number of current sources to be used in the last sub-DAC that are on or otherwise to select a fractional current in this last sub-DAC 720.

Figure 10:
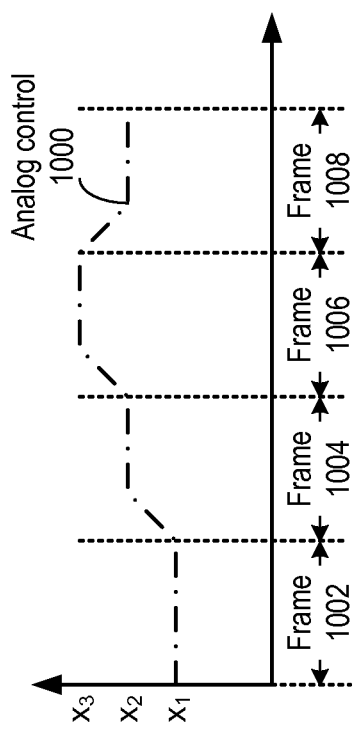
FIG. 10 illustrates an embodiment an analog control 1000.

FIG. 10 illustrates an embodiment an analog control 1000. In this embodiment, an analog control 1000 is presented that represents the number of micro-current sources 420 or sub-DACs 720 that are turned-on at any given time. The analog control 1000 controls the maximum DAC output on a frame-by-frame basis to track power requirements. Sub-DACs 720 or micro-current sources 420 can be turned on or off digitally for each new digital value—however, the maximum current is controlled via MCS analog control 414 or 714 on a frame-by-frame basis to reflect the maximum number of sub-carriers in use or otherwise an expected maximum current.

In the example shown, for four frame periods ($t_0$ to $t_1$), ($t_1$ to $t_2$), ($t_2$ to $t_3$), and ($t_3$ to $t_4$), corresponding to respective maximum outputs $x_1$, $x_2$, $x_3$ and $x_2$ are shown. Ramping (up or down) are shown at the beginning of each frame provides smoother frame transitions. Powering selected frames to less than the maximum allowable current saves power. Lag in current transitions at frame boundaries can be compensated by an inter-frame gap. In the alternative a 1 μsec time for reference current transitions may have an acceptable degradation in fidelity.

While analog control 1000 is described above as being controlled on a frame-by-frame basis, other control periods can be employed. For example, analog control 1000 can be controlled on a symbol-by-symbol basis to provide a sufficient maximum current to meet the needs of each new symbol. Ramping (up or down) can be employed at the beginning of each symbol period to provide smoother symbol transitions. Powering selected symbols to less than the maximum allowable current can save power when the maximum current is not required for a symbol. Lag in current transitions at symbol boundaries can be compensated by the time period of the cyclic prefix.

Figure 11:
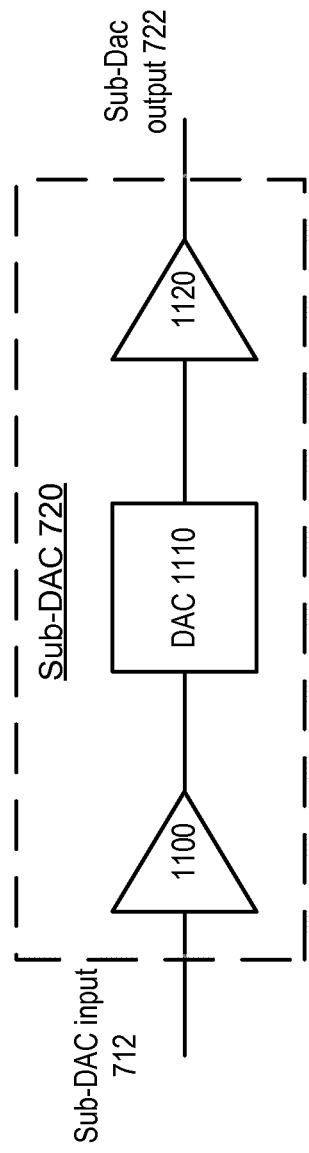
FIG. 11 illustrates an embodiment of a sub-DAC 720.

FIG. 11 illustrates an embodiment of a sub-DAC 720. A sub-DAC 720 is presented that includes a digital gain element 1100, a DAC 1110 and an analog gain element 1120. In particular, sub-DAC 1110 can include a plurality of micro-current sources or a plurality of other current sources as previously described in conjunction with FIGS. 1-10 or other DAC configuration.

Transmission power changes with the number of sub-carriers used. In this embodiment, digital gain element 1100 implements DAC scaling (digital gain control) to utilize the full dynamic range of the sub-DAC 1110. The sub-DAC 1110 is followed by analog gain element 1120 to provide symbol normalization to maximize SNR. This configuration provides the advantage that the signal to noise ratio does not add linearly in this parallel sub-DAC structure. While quantization noise adds so do signal levels—preserving the same signal to noise ratio in the overall output as the signal to noise ratio for each sub-DAC branch.

In an embodiment, each sub-DAC 720 could be assigned to a separate OFDM sub-carrier such that resolution of each is 12 bits, as opposed to a composite DAC having 17 bits of resolution that services all tones. Sub-DACs 720 can be assigned to each sub-carrier in use—unused sub-DACs can be turned off to promote energy efficiency.

In another embodiment, each sub-DAC 720 can service multiple tones. Some sub-DACs 720 may service differing numbers of tones that other sub-DACS 720. The DAC allocation and scaling may be altered on a frame-by-frame basis or may more slowly be altered as OFDMA allocations change, for example, based on control signals 316.

Figure 12:
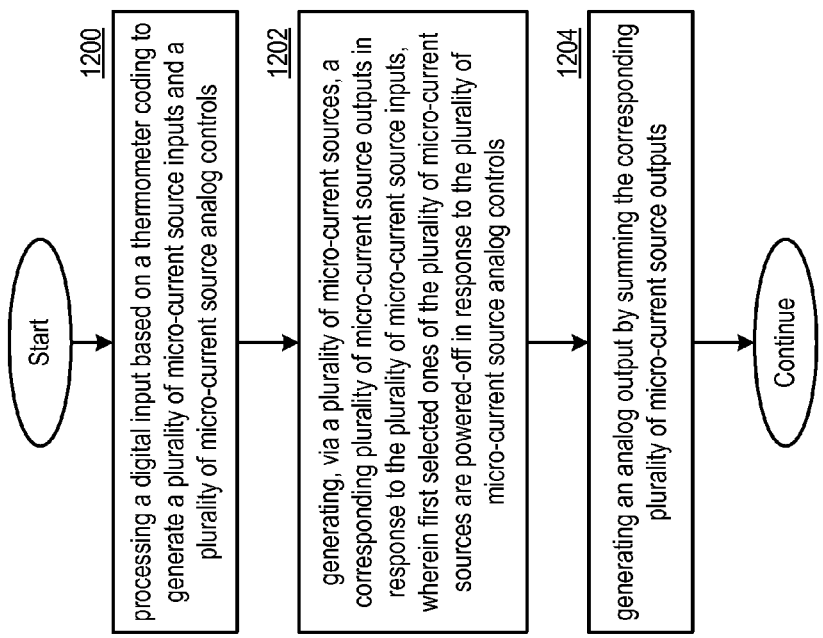
FIG. 12 illustrates an embodiment of a method in accordance with the disclosure.

FIG. 12 illustrates an embodiment of a method in accordance with the disclosure. In particular, a method is presented for use with one or more functions and features described in conjunction with FIGS. 1-11. Step 1200 includes processing a digital input based on a thermometer coding to generate a plurality of micro-current source inputs and a plurality of micro-current source analog controls. Step 1202 includes generating, via a plurality of micro-current sources, a corresponding plurality of micro-current source outputs in response to the plurality of micro-current source inputs, wherein first selected ones of the plurality of micro-current sources are powered-off in response to the plurality of micro-current source analog controls. Step 1204 includes generating an analog output by summing the corresponding plurality of micro-current source outputs.

In an embodiment, the plurality of micro-current source inputs are ternary-coded. The plurality of micro-current source outputs can have a positive current state and/or a negative current state and a neutral current state. The plurality of micro-current source inputs can be generated to ramp the analog output from a prior value to a new value. The plurality of micro-current source inputs are generated to generate currents from second selected ones of the plurality of ternary-coded micro-current sources. The second selected ones of the plurality of micro-current sources can be a proper subset of the first selected ones of the plurality of micro-current sources. The first selected ones of the plurality of micro-current sources can include x+C of the plurality of micro-current sources, where the second selected ones of the plurality of micro-current sources include x of the plurality micro-current sources and wherein C is a predetermined value or other value.

Figure 13:
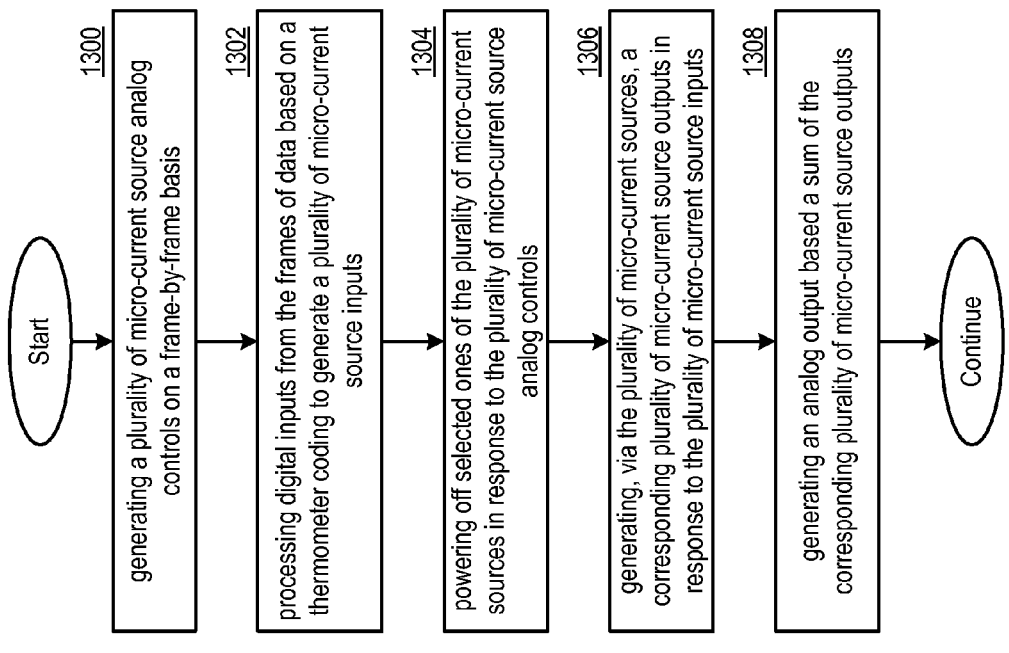
FIG. 13 illustrates an embodiment of a method in accordance with the disclosure.

FIG. 13 illustrates an embodiment of a method in accordance with the disclosure. In particular, a method is presented for use with one or more functions and features described in conjunction with FIGS. 1-12. Step 1300 includes generating a plurality of micro-current source analog controls on a frame-by-frame basis. Step 1302 includes processing digital inputs from the frames of data based on a thermometer coding to generate a plurality of micro-current source inputs. Step 1304 includes powering off selected ones of the plurality of micro-current sources in response to the plurality of micro-current source analog controls. Step 1306 includes generating, via the plurality of micro-current sources, a corresponding plurality of micro-current source outputs in response to the plurality of micro-current source inputs. Step 1308 includes generating an analog output based a sum of the corresponding plurality of micro-current source outputs.

In an embodiment, the plurality of micro-current source analog controls are generated based on a control signal. The control signal can be generated based on media access control (MAC) layer processing of the plurality of frames of data.

In an embodiment, the plurality of micro-current source inputs are ternary-coded. The plurality of micro-current source outputs can have a positive current state and/or a negative current state and a neutral current state. The plurality of micro-current source inputs can be generated to ramp the analog output from a prior value to a new value.

Figure 14:
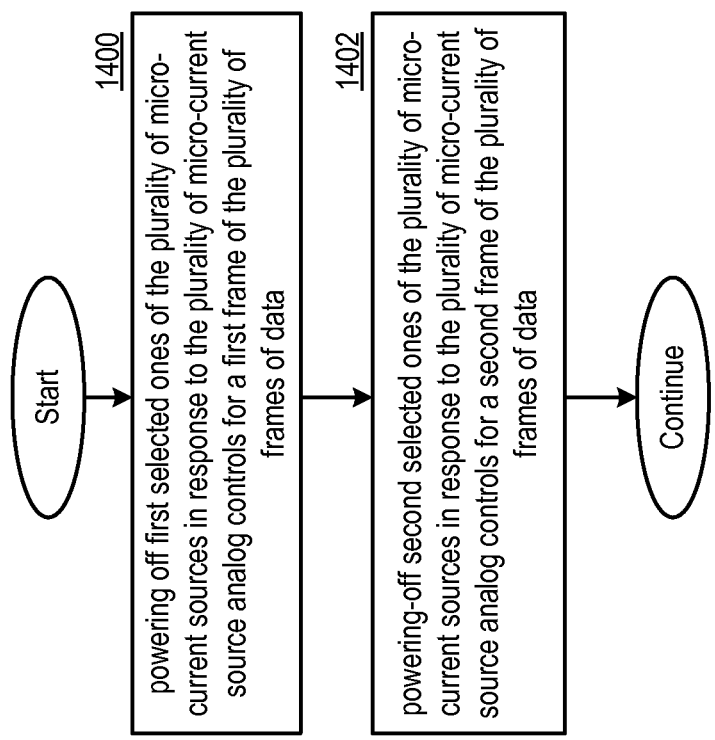
FIG. 14 illustrates an embodiment of a method in accordance with the disclosure.

FIG. 14 illustrates an embodiment of a method in accordance with the disclosure. In particular, a method is presented for use with one or more functions and features described in conjunction with FIGS. 1-13. Step 1400 includes powering off first selected ones of the plurality of micro-current sources in response to the plurality of micro-current source analog controls for a first frame of the plurality of frames of data. Step 1402 includes powering-off second selected ones of the plurality of micro-current sources in response to the plurality of micro-current source analog controls for a second frame of the plurality of frames of data.

In an embodiment, the plurality of micro-current source analog controls are generated to ramp from powering-off the first selected ones of the plurality of micro-current sources to powering-off the second selected ones of the plurality of micro-current sources to transition from the first frame of the plurality of frames of data to the second frame of the plurality of frames of data.

While analog controls are described above in conjunction with FIGS. 13 and 14 as being controlled on a frame-by-frame basis, other control periods can be employed. For example, analog controls can be generated on a symbol-by-symbol basis to provide a sufficient maximum current to meet the needs of each new symbol. Ramping (up or down) can be employed at the beginning of each symbol period to provide smoother symbol transitions. Powering selected symbols to less than the maximum allowable current can save power when the maximum current is not required for a symbol. Lag in current transitions at symbol boundaries can be compensated by the time period of the cyclic prefix.

It is noted that terminologies as may be used herein such as bit stream, stream, signal sequence, etc. (or their equivalents) have been used interchangeably to describe digital information whose content corresponds to any of a number of desired types (e.g., data, video, speech, audio, etc. any of which may generally be referred to as 'data').

As may be used herein, the terms "substantially" and "approximately" provides an industry-accepted tolerance for its corresponding term and/or relativity between items. Such an industry-accepted tolerance ranges from less than one percent to fifty percent and corresponds to, but is not limited to, component values, integrated circuit process variations, temperature variations, rise and fall times, and/or thermal noise. Such relativity between items ranges from a difference of a few percent to magnitude differences. As may also be used herein, the term(s) "configured to", "operably coupled to", "coupled to", and/or "coupling" includes direct coupling between items and/or indirect coupling between items via an intervening item (e.g., an item includes, but is not limited to, a component, an element, a circuit, and/or a module) where, for an example of indirect coupling, the intervening item does not modify the information of a signal but may adjust its current level, voltage level, and/or power level. As may further be used herein, inferred coupling (i.e., where one element is coupled to another element by inference) includes direct and indirect coupling between two items in the same manner as "coupled to". As may even further be used herein, the term "configured to", "operable to", "coupled to", or "operably coupled to" indicates that an item includes one or more of power connections, input(s), output(s), etc., to perform, when activated, one or more its corresponding functions and may further include inferred coupling to one or more other items. As may still further be used herein, the term "associated with", includes direct and/or indirect coupling of separate items and/or one item being embedded within another item.

As may also be used herein, the terms "processing module", "processing circuit", "processor", and/or "processing unit" may be a single processing device or a plurality of processing devices. Such a processing device may be a microprocessor, micro-controller, digital signal processor, microcomputer, central processing unit, field programmable gate array, programmable logic device, state machine, logic circuitry, analog circuitry, digital circuitry, and/or any device that manipulates signals (analog and/or digital) based on hard coding of the circuitry and/or operational instructions. The processing module, module, processing circuit, and/or processing unit may be, or further include, memory and/or an integrated memory element, which may be a single memory device, a plurality of memory devices, and/or embedded circuitry of another processing module, module, processing circuit, and/or processing unit. Such a memory device may be a read-only memory, random access memory, volatile memory, non-volatile memory, static memory, dynamic memory, flash memory, cache memory, and/or any device that stores digital information. Note that if the processing module, module, processing circuit, and/or processing unit includes more than one processing device, the processing devices may be centrally located (e.g., directly coupled together via a wired and/or wireless bus structure) or may be distributedly located (e.g., cloud computing via indirect coupling via a local area network and/or a wide area network). Further note that if the processing module, module, processing circuit, and/or processing unit implements one or more of its functions via a state machine, analog circuitry, digital circuitry, and/or logic circuitry, the memory and/or memory element storing the corresponding operational instructions may be embedded within, or external to, the circuitry comprising the state machine, analog circuitry, digital circuitry, and/or logic circuitry. Still further note that, the memory element may store, and the processing module, module, processing circuit, and/or processing unit executes, hard coded and/or operational instructions corresponding to at least some of the steps and/or functions illustrated in one or more of the Figures. Such a memory device or memory element can be included in an article of manufacture.

One or more embodiments have been described above with the aid of method steps illustrating the performance of specified functions and relationships thereof. The boundaries and sequence of these functional building blocks and method steps have been arbitrarily defined herein for convenience of description. Alternate boundaries and sequences can be defined so long as the specified functions and relationships are appropriately performed. Any such alternate boundaries or sequences are thus within the scope and spirit of the claims. Further, the boundaries of these functional building blocks have been arbitrarily defined for convenience of description. Alternate boundaries could be defined as long as the certain significant functions are appropriately performed. Similarly, flow diagram blocks may also have been arbitrarily defined herein to illustrate certain significant functionality.

To the extent used, the flow diagram block boundaries and sequence could have been defined otherwise and still perform the certain significant functionality. Such alternate definitions of both functional building blocks and flow diagram blocks and sequences are thus within the scope and spirit of the claims. One of average skill in the art will also recognize that the functional building blocks, and other illustrative blocks, modules and components herein, can be implemented as illustrated or by discrete components, application specific integrated circuits, processors executing appropriate software and the like or any combination thereof.

In addition, a flow diagram may include a "start" and/or "continue" indication. The "start" and "continue" indications reflect that the steps presented can optionally be incorporated in or otherwise used in conjunction with other routines. In this context, "start" indicates the beginning of the first step presented and may be preceded by other activities not specifically shown. Further, the "continue" indication reflects that the steps presented may be performed multiple times and/or may be succeeded by other activities not specifically shown. Further, while a flow diagram indicates a particular ordering of steps, other orderings are likewise possible provided that the principles of causality are maintained.

The one or more embodiments are used herein to illustrate one or more aspects, one or more features, one or more concepts, and/or one or more examples. A physical embodiment of an apparatus, an article of manufacture, a machine, and/or of a process may include one or more of the aspects, features, concepts, examples, etc. described with reference to one or more of the embodiments discussed herein. Further, from figure to figure, the embodiments may incorporate the same or similarly named functions, steps, modules, etc. that may use the same or different reference numbers and, as such, the functions, steps, modules, etc. may be the same or similar functions, steps, modules, etc. or different ones.

While the transistors in the above described figure(s) is/are shown as field effect transistors (FETs), as one of ordinary skill in the art will appreciate, the transistors may be implemented using any type of transistor structure including, but not limited to, bipolar, metal oxide semiconductor field effect transistors (MOSFET), N-well transistors, P-well transistors, enhancement mode, depletion mode, and zero voltage threshold (VT) transistors.

Unless specifically stated to the contra, signals to, from, and/or between elements in a figure of any of the figures presented herein may be analog or digital, continuous time or discrete time, and single-ended or differential. For instance, if a signal path is shown as a single-ended path, it also represents a differential signal path. Similarly, if a signal path is shown as a differential path, it also represents a single-ended signal path. While one or more particular architectures are described herein, other architectures can likewise be implemented that use one or more data buses not expressly shown, direct connectivity between elements, and/or indirect coupling between other elements as recognized by one of average skill in the art.

The term "module" is used in the description of one or more of the embodiments. A module implements one or more functions via a device such as a processor or other processing device or other hardware that may include or operate in association with a memory that stores operational instructions. A module may operate independently and/or in conjunction with software and/or firmware. As also used herein, a module may contain one or more sub-modules, each of which may be one or more modules.

While particular combinations of various functions and features of the one or more embodiments have been expressly described herein, other combinations of these features and functions are likewise possible. The present disclosure is not limited by the particular examples disclosed herein and expressly incorporates these other combinations.

What is claimed is:

1. A digital to analog converter (DAC) comprising:
a first thermometer coder configured to process a digital input based on a first thermometer coding to generate a plurality of sub-DAC inputs and a plurality of sub-DAC analog controls;
a plurality of sub-DACs, coupled to the first thermometer coder, configured to generate a corresponding plurality of sub-DAC outputs in response to the plurality of sub-DAC inputs, wherein first selected ones of the plurality of sub-DACs are powered-off in response to the plurality of sub-DAC analog controls; and
a first summing circuit, coupled to the plurality of sub-DACs, configured to generate an analog output based a sum of the corresponding plurality of sub-DAC outputs.

2. The DAC of claim 1 wherein the first thermometer coder is configured to process a first portion of the digital input based on the first thermometer coding to generate the plurality of sub-DAC inputs and the plurality of sub-DAC analog controls.

3. The DAC of claim 2 wherein the first portion of the digital input includes a group of bits selected from the digital input.

4. The DAC of claim 2 wherein the first portion of the digital input includes a group of most significant bits selected from the digital input.

5. The DAC of claim 2 wherein at least one of the plurality of sub-DACs includes:
a second thermometer coder configured to process a second portion of the digital input based on a second thermometer coding to generate a plurality of micro-current source inputs and a plurality of micro-current source analog controls;
a plurality of micro-current sources, coupled to the second thermometer coder, configured to generate a corresponding plurality of micro-current source outputs in response to the plurality of micro-current source inputs, wherein first selected ones of the plurality of micro-current sources are powered-off in response to the plurality of micro-current source analog controls; and
a second summing circuit, coupled to the plurality of micro-current sources, configured to generate a corresponding one of the plurality of sub-DAC outputs based a sum of the corresponding plurality of micro-current source outputs.

6. The DAC of claim 5 wherein the plurality of micro-current source outputs have one of: a positive current state, a negative current state and a neutral current state.

7. The DAC of claim 1 wherein the first thermometer coder is configured to process a first value of the digital input based on the first thermometer coding to generate the plurality of sub-DAC inputs to ramp from a prior value of the analog output to a new value corresponding the first value of the digital input.

8. A digital to analog converter (DAC) comprising:
a sub-DAC coder configured to process a digital input to generate a plurality of sub-DAC inputs and a plurality of sub-DAC analog controls;
a plurality of sub-DACs, coupled to the sub-DAC coder, configured to generate a corresponding plurality of sub-DAC outputs in response to the plurality of sub-DAC inputs, wherein first selected ones of the plurality of sub-DACs are powered-off in response to the plurality of sub-DAC analog controls; wherein at least one of the plurality of sub-DACs includes:
a thermometer coder configured to process a second portion of the digital input based on a thermometer coding to generate a plurality of micro-current source inputs and a plurality of micro-current source analog controls;
a plurality of micro-current sources, coupled to the thermometer coder, configured to generate a corresponding plurality of micro-current source outputs in response to the plurality of micro-current source inputs, wherein first selected ones of the plurality of micro-current sources are powered-off in response to the plurality of micro-current source analog controls; and a first summing circuit, coupled to the plurality of micro-current sources, configured to generate a corresponding one of the plurality of sub-DAC outputs based a sum of the corresponding plurality of micro-current source outputs; and a second summing circuit, coupled to the plurality of sub-DACs, configured to generate an analog output based a sum of the corresponding plurality of sub-DAC outputs.

9. The DAC of claim 8 wherein the sub-DAC coder is configured to process a first portion of the digital input to generate the plurality of sub-DAC inputs and the plurality of sub-DAC analog controls.

10. The DAC of claim 9 wherein the first portion of the digital input includes a group of bits selected from the digital input.

11. The DAC of claim 9 wherein the first portion of the digital input includes a group of most significant bits selected from the digital input.

12. The DAC of claim 8 wherein the plurality of micro-current source outputs have one of: a positive current state, a negative current state and a neutral current state.

13. The DAC of claim 8 wherein the sub-DAC coder is configured to process a first value of the digital input to generate the plurality of sub-DAC inputs to ramp from a prior value of the analog output to a new value corresponding the first value of the digital input.

14. A method for us in a digital to analog converter (DAC), the method comprising:

processing a digital input based on a thermometer coding to generate a plurality of sub-DAC inputs and a plurality of sub-DAC analog controls;

generating, via a plurality of sub-DACs, a corresponding plurality of sub-DAC outputs in response to the plurality of sub-DAC inputs;

powering off first selected ones of the plurality of sub-DACs in response to the plurality of sub-DAC analog controls; and generating an analog output based a sum of the corresponding plurality of sub-DAC outputs.

15. The method of claim 14 wherein the thermometer coding processes a first portion of the digital input to generate the plurality of sub-DAC inputs and the plurality of sub-DAC analog controls.

16. The method of claim 15 wherein the first portion of the digital input includes a group of bits selected from the digital input.

17. The method of claim 15 wherein the first portion of the digital input includes a group of most significant bits selected from the digital input.

18. The method of claim 14 further comprising:

processing a first value of the digital input based on the thermometer coding to generate the plurality of sub-DAC inputs to ramp from a prior value of the analog output to a new value corresponding the first value of the digital input.

19. The method of claim 14, wherein the plurality of sub-DAC analog controls are generated on a frame-by-frame basis.

20. The method of claim 19 wherein powering off first selected ones of the plurality of sub-DACs in response to the plurality of sub-DAC analog controls includes powering off first selected ones of the plurality of sub-DACs in response to the plurality of sub-DAC analog controls for a first frame of the digital input, and the method further comprises:

powering-off second selected ones of the plurality of sub-DACs in response to the plurality of sub-DAC analog controls for a second frame of the digital input.

\* \* \* \* \*